United States Patent [19]

Takano et al.

[11] Patent Number: 5,368,140
[45] Date of Patent: Nov. 29, 1994

[54] DAMPER DEVICE AND METHOD OF ITS USE, AND A DEVICE FOR MANUFACTURING SEMICONDUCTORS USING THE DAMPER DEVICE

[75] Inventors: Kazuya Takano; Seiji Onai, both of Kanagawa, Japan

[73] Assignee: Bridgestone Corporation, Tokyo, Japan

[21] Appl. No.: 132,126

[22] Filed: Oct. 5, 1993

Related U.S. Application Data

[63] Continuation of Ser. No. 803,261, Dec. 5, 1991, abandoned.

[30] Foreign Application Priority Data

Dec. 10, 1990 [JP] Japan ................. 2-407219
Mar. 1, 1991 [JP] Japan ................. 3-057625
Aug. 26, 1991 [JP] Japan ................. 3-238699

[51] Int. Cl.$^5$ ............................................. B60G 11/10
[52] U.S. Cl. ........................ 188/267; 188/298; 188/300; 188/322.19; 188/322.5
[58] Field of Search ............ 188/267, 279, 297, 298, 188/299, 300, 322.19, 322.5; 267/122, 140.14; 280/707

[56] References Cited

U.S. PATENT DOCUMENTS

| | | | |
|---|---|---|---|
| 1,941,989 | 1/1934 | Larsen | 188/298 X |
| 2,606,631 | 8/1952 | Grooms | 188/298 |
| 2,936,860 | 5/1960 | Peras | 188/298 |
| 3,266,603 | 8/1966 | Kamimoto | 188/97 X |
| 4,351,515 | 9/1982 | Yoshida | 188/267 X |
| 4,572,488 | 2/1986 | Holmberg, Jr. et al. | 188/298 X |
| 4,858,733 | 8/1989 | Noguchi et al. | 188/267 |
| 5,014,829 | 5/1991 | Hare, Sr. | 188/267 |
| 5,018,606 | 5/1991 | Carlson | 188/267 |
| 5,076,403 | 12/1991 | Mitsui | 188/267 |
| 5,161,653 | 10/1992 | Hare, Sr. | 188/300 X |

FOREIGN PATENT DOCUMENTS

| | | | |
|---|---|---|---|
| 231028 | 9/1988 | Japan | 188/267 |
| 603566 | 6/1948 | United Kingdom | 188/298 |
| 1175255 | 12/1969 | United Kingdom | 188/298 |
| 1282568 | 7/1972 | United Kingdom | 188/267 |
| 2111171 | 6/1983 | United Kingdom | |
| 588420 | 1/1978 | U.S.S.R. | 188/298 |

*Primary Examiner*—Robert J. Oberleitner
*Assistant Examiner*—Lee W. Young
*Attorney, Agent, or Firm*—Jordan and Hamburg

[57] ABSTRACT

A damper device has a fixed member and a movable member, one being inside of the other. An electroviscous fluid is sealed between these two members, and opposed electrodes are arranged at respective positions of the two members to allow relative flow of the electroviscous fluid. The portions of the movable and fixed members that are in sliding contact are shielded against the electroviscous fluid by a flexible member between these two members. In an apparatus for manufacturing semiconductors according to the invention, an arm is provided on the movable member to move along the axial direction of the guide bar when the movable member moves. A flexible member is provided between respective ends of the fixed guide bar and respective ends of the arm to maintain the internal space liquid-tight, and an electroviscous fluid is sealed inside the flexible member and between the arm and the guide bar. A positive electrode and a negative electrode are formed utilizing two opposed members such as the arm and the guide bar, to which a voltage is applied to the electrodes while the voltage application is suspended when the movable member is to be moved.

2 Claims, 9 Drawing Sheets

DAMPER DEVICE AND METHOD OF ITS USE, AND A DEVICE FOR MANUFACTURING SEMICONDUCTORS USING THE DAMPER DEVICE

This application is a continuation of application Ser. No. 07/803,261 filed Dec. 5, 1991, now abandoned.

BACKGROUND OF THE INVENTION

The present invention relates to a damper device which can vary the damping force, and more particularly, to a damper device which can effectively prevent leakage of electroviscous fluid or mixing of air in the fluid, and a method of its use. It also relates to a device for manufacturing semiconductors using the damper device.

As an example of a prior art damper device capable of varying the damping force by utilizing an electroviscous fluid and electrodes, the published specification of UK No. 2,111,171 discloses a device comprising a cylinder that houses a piston and encloses electroviscous fluid.

The prior art device is defective in that as the electroviscous fluid directly contacts the portions where the cylinder and the piston or the piston rod are in sliding contact with each other, the electroviscous fluid is likely to leak from such portions. It is further defective in that outside air may enter the cylinder through the portions. In either cases, the damping characteristics of the device deteriorates.

In the prior art, when the movable member stops moving, it generates damped vibrations due to its inertia, substantially prolonging the time required for the member to come to a complete stop at a predetermined position. This poses a grave problem particularly when the mass and/or speed of the movable member are great. Efficiency in the positioning decreases as the operator must wait until the movable member comes to a complete stop; otherwise, precision in positioning itself significantly decreases. Although it has been proposed to dispose a damper having a higher damping capacity between the stationary member and the movable member to more quickly bring the movable member to a complete stop at a given position, this entails a different problem that energy required to drive the movable member increases greatly.

Further, when such damper device is used in an apparatus for manufacturing semiconductors with movable members such as a stepper, defects similar to those encountered in the damper device also arise.

SUMMARY OF THE INVENTION

The present invention aims at effectively solving these problems encountered in the prior art and providing a damper device which is capable of effectively preventing leakage of electroviscous fluid as well as mixing of air into the fluid.

The damper device according to the present invention comprises a stationary member and a movable member positioned relative to each other, one being inside of the other, an electroviscous fluid sealed in between the two members, and electrodes respectively disposed at the stationary and the movable members and opposing each other to allow the electroviscous fluid to relatively flow, and is characterized in that a flexible member is provided extending between the movable and the stationary members at their respective portions where the two members come in sliding contact with each other to shield the same from the electroviscous fluid.

According to the present invention, separate electrodes may be provided independently on each of these members; alternatively, each of such members may be made of an electrode material.

In the damper device according to the present invention, vibrations are damped as intended based on the suitably selected interval between the members as the kinetic energy of the movements of the movable member relative to the stationary member or a container with an upper open end is converted into thermal energy by causing the electroviscous fluid to flow between them.

To increase the damping force, a given voltage is applied to the electrodes provided in the flow passage of the electroviscous fluid to increase the viscosity thereof and to thereby generate a damping force that corresponds to the intensity of the electric field.

The portions where the movable and stationary members come in sliding contact are shielded from the electroviscous fluid by means of a flexible member to prevent leakage of the electroviscous fluid and to prevent outside air from entering and becoming mixed in the fluid during the above mentioned relative movements.

Another aspect of this invention lies in that the time duration of damped vibrations which occur when the movable member which is capable of linear or rotational movements is stopped for positioning is significantly reduced. It also aims at providing a method of using the damper device in order to decrease the energy required drive the movable member to a sufficiently low level.

According to the method of the present invention, the damper device comprising a stationary member, a movable member, a positive and a negative electrode provided respectively on these members and opposing each other, and an electroviscous fluid sealed in between the two electrodes is used in such a manner that when the movable member is to be stopped for positioning, a given level of voltage is applied to the electrodes, while the voltage application is suspended when the movable member is to be moved.

In driving the movable member, voltage application is preferably suspended prior to the actual start of the movement of the member for the time duration equivalent to the rising time of the voltage to take into consideration the time constant of the electric circuit.

According to the present invention, a voltage is applied to the electrodes to thereby generate an electric field therebetween when the movable member is stopped for positioning. By increasing the viscosity of the electroviscous fluid to a level corresponding to the intensity of the electric field, the energy generated by the displacement of the movable member relative to the stationary member is effectively absorbed by the electroviscous fluid. As a result, duration of damped vibrations is significantly reduced as compared with the prior art, enabling very prompt positioning of the movable member at a predetermined location.

By suspending the voltage application to the electrodes when the movable member is to be moved, the electric field is cancelled and as the electroviscous fluid thereby restores its original minimum viscosity intrinsic to it, and amount of energy necessary for driving the member can be sufficiently reduced.

It is noted that the movable member is preferably delayed in its start of movement for the time equivalent to the rise time of the voltage to take into consideration the time constant of the electric circuit, or the time lag from the time when the power source is cut off until the voltage between the electrodes becomes zero and the time lag for the fluid to restore its intrinsic viscosity. This enables the movable member to resume its movement with a lower activation energy and at a higher speed without interference from the electroviscous fluid.

Because the rising time of the voltage is much shorter than said trailing time, the time constant of the electric circuit at the time of voltage application to the electrodes can be ignored.

Thus, the present invention enables the movable member to be very quickly stopped and positioned at a predetermined location, and the energy required for driving the movable member to move can be reduced to a sufficiently low level.

The apparatus for manufacturing semiconductors according to the present invention aims at reducing the total time of one cycle by reducing the time required for moving as well as suspending the movable member and allowing the same to operate at accurate positions.

To achieve these aims, the present invention semiconductor apparatus is characterized in that a movable member is provided with an arm that moves along the axial line of a guide bar as the movable member moves, a flexible member is attached to both ends of the fixed guide bar and of the movable arm respectively so as to form a liquid-tight space inside, an electroviscous fluid is sealed inside the flexible member as well as in between the arm and the guide bar, and a positive electrode and a negative electrode are provided on members that oppose each other such as the guide bar and the arm and are connected to a power source, and a voltage is applied to the electrodes when the movable member is to be stopped and positioned, and suspended when the movable member is to be moved.

By applying or suspending a voltage to the electroviscous fluid, movement of the movable member can be stopped in a short period of time and, when activated, it can move smoothly at a high speed. Even when the movable member is moved at a higher speed than in the prior art, it can be quickly stopped as the voltage is applied to the electroviscous fluid to thereby increase its viscosity. In this manner the present invention acts as a damper device and reduces the time required to stop the movable member. When the movable member is to be moved, on the other hand, application of voltage to the fluid is suspended to decrease its viscosity and to thereby reduce the energy required for driving the member.

DESCRIPTION OF THE PREFERRED EMBODIMENTS

The present invention will now be described referring to the accompanying drawings.

Figure 1:
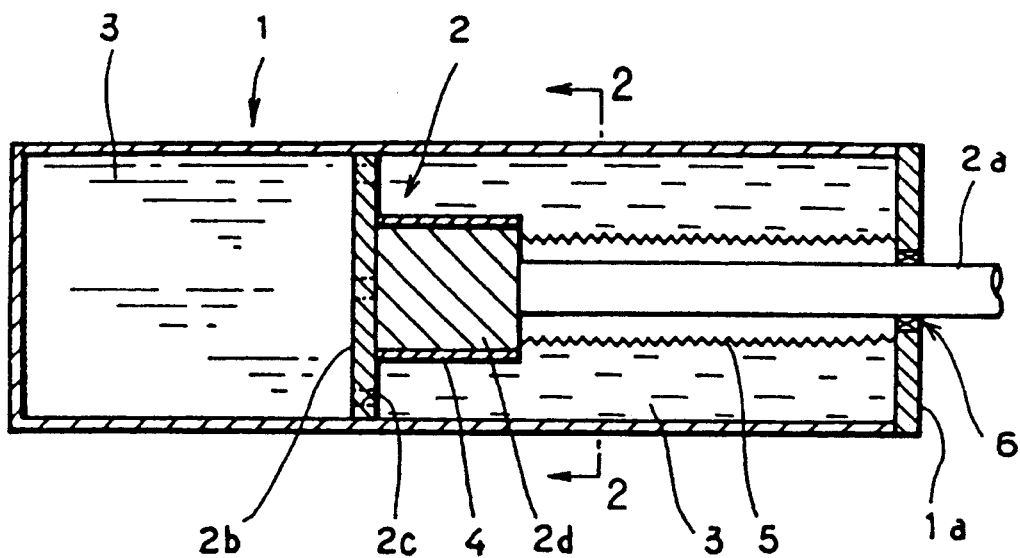
FIG. 1 is a vertical sectional view of a damper device at its center according to the first embodiment of the present invention.
Figure 2:
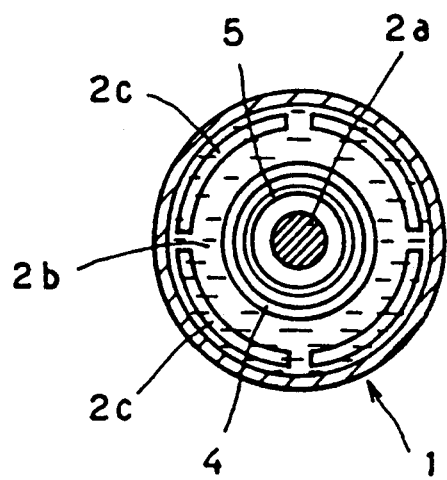
FIG. 2 is a sectional view along the line 2—2 in FIG. 1.

FIGS. 1 and 2 are sectional views to show the first embodiment of a damper device according to the present invention, in which the reference number 1 denotes a cylinder or the stationary member, 2 a piston or the movable member which disposed inside the cylinder and which slides along and contacts with the cylinder wall at its forward end. A rod 2a formed at the rear end of the piston 2 to penetrate through one end wall 1a of the cylinder 1 also slidingly contacts the end wall 1a.

In the embodiment shown, through-holes 2c in the number and size necessary to allow the electroviscous fluid to flow are provided on the portion 2b of the piston 2 with larger diameter that slides along the wall. An electroviscous fluid 3 is sealed inside the cylinder on both sides of the portion 2b with a larger diameter. An electrode is provided on the outer periphery of an intermediate portion 2d of the piston 2 at the back of the portion 2b. The walls of the cylinder opposing each other across the fluid 3 as well as the cylinder itself are made of an electrode material to thereby generate an electric field corresponding to the intensity of the voltage applied to the electrodes. Further, a bellows 5 or the flexible member surrounds the rod 2a connecting the end face of the intermediate portion 2d of the piston 2 and the end wall 1a of the cylinder in a liquid-tight manner to shield the portion 6 where the rod 2a and the cylinder end wall 1a contact each other from the electroviscous fluid. As the bellows 5, resilient material such as rubber and polyethylene, urethane and other synthetic resins may be used.

In the embodiment shown in the figures, the portion 2b with a large diameter also comes in contact with the cylinder end wall. Since leakage of the electroviscous fluid 3 at this portion is of no significance at all, the bellows 5 is not provided to shield the portion from the fluid.

The flexible member is preferably of a structure and/or material which expands/contracts with little resistance in the sliding direction of the rod 2a or in the axial direction but which is less likely to deflect in the direction orthogonal to the axial direction to secure a flow path for the fluid 3. In this regard, a bellows is most preferable.

The damper device of the above construction, for example, damps the vibrations under normal state by causing the movable member or the piston 2, to move inside the cylinder by the action of the rod 2a connected to a vibrating member, and by causing the electroviscous fluid 3 to flow via through-holes 2c provided on the portion 2b of the piston 2 to thereby convert the vibrational energy to thermal energy.

Figure 3:
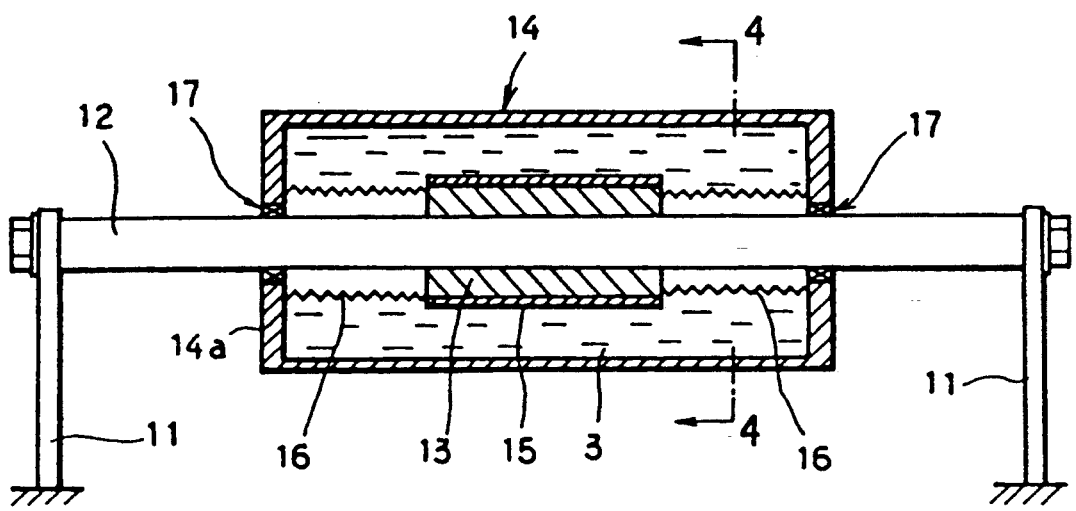
FIG. 3 is a vertical sectional view of a damper device at its center according to the second embodiment of the present invention.
Figure 4:
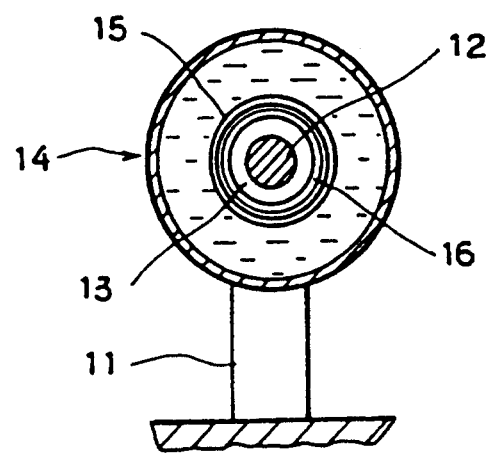
FIG. 4 is sectional view along the line 4—4 in FIG. 3.

FIGS. 3 and 4 are sectional views to show a second embodiment of the damper, wherein at the center of a center shaft 12 supported on either sides with supports 11 is fixed or adhered a cylindrical stationary member 13, and an outer sheath member 14 which is the movable member encloses the stationary member 13 and is attached to either end walls 14a in a freely slidable manner in the axial direction of the shaft 12. The electroviscous fluid 3 is filled in between the members 13 and 14. An electrode 15 is attached on the peripheral surface of the stationary member 13. At least the cylindrical portion of said outer sheath member 14 is made of an electrode material, so that a voltage can be applied between the two electrodes. The both end faces of the stationary member 13 and the end walls 14a are connected by bellows 16 in a liquid tight manner to shield from the fluid 3 the portions 17 where the shaft 12 and the end walls 14a are sliding contact.

In this damper device, vibrations damped by the flow of the electroviscous fluid 3 between the stationary member 13 and the outer sheath member 14, said flow being caused by the vibrations in the axial direction of the shaft 12, of the outer sheath member 14 connected to a vibrating means. The degree of damping can be increased as required by adjusting the intensity of the electric field between the electrode 15 and the outer sheath member 14.

Leakage of the fluid 3 and mixing of outside air in the fluid can both be very effectively prevented by the action of the bellows 16.

Figure 5:
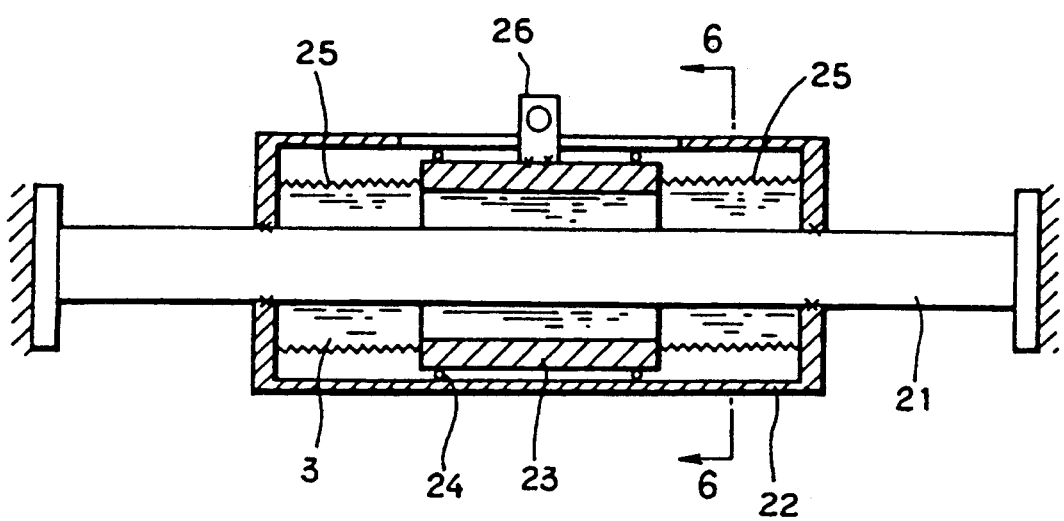
FIG. 5 is vertical sectional view of a damper device at its center according to the third embodiment of the present invention.
Figure 6:
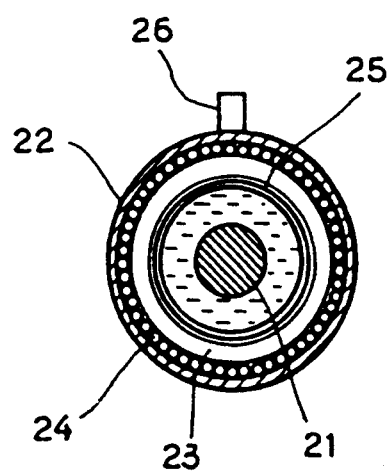
FIG. 6 is sectional view along the line 6—6 in FIG. 5.
Figure 7:
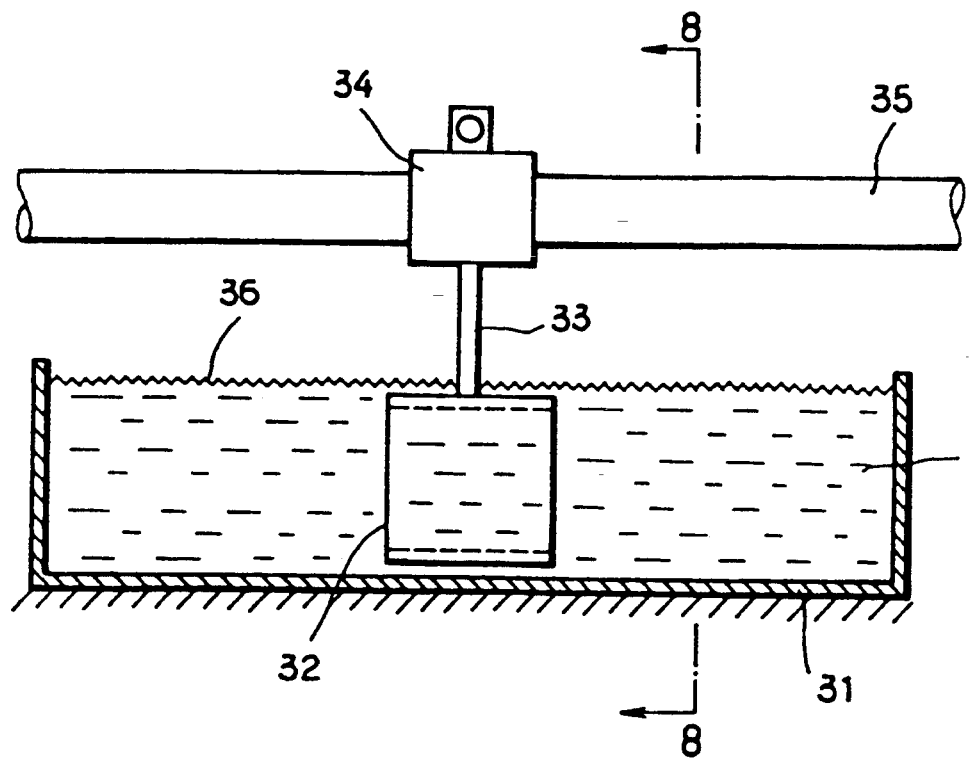
FIG. 7 is a vertical sectional view of a damper device at its center according to the fourth embodiment of the present invention.
Figure 8:
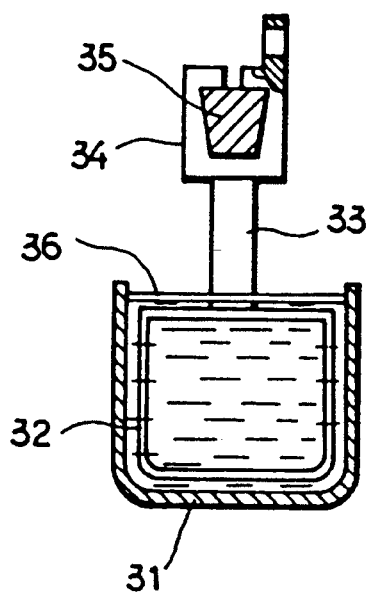
FIG. 8 is a sectional view along the line 8—8 in FIG. 7.

FIGS. 5 and 6 are sectional views to show the third embodiment of the present invention, which comprises as the stationary members or a shaft 21 fixed on both ends and the outer sheath member 22 fixed or adhered thereto, and an inner sheath member 23 as the movable member which is provided inside the outer sheath member 22 via a sliding guide 24 such as bearings. The electroviscous fluid 3 is filled in between the inner sheath member 23 and the stationary member. The shaft and the inner sheath member per se also function as electrodes. Both end walls of the outer sheath member 22 and both end faces of the inner sheath member 23 are respectively connect ed by bellows 25 in a liquid-tight manner. The portions where the outer sheath member 22 and the inner sheath member 23 come in sliding contact with each other are thus shielded from the fluid 3. As a result, although there is provided a slit on the outer sheath member 22 to allow a bracket 26 fixed on the inner sheath member 23 to protrude from the outer sheath member 22 and to allow the bracket to move in the axial direction of the outer sheath member 22, leakage of the fluid 3 from this slit can be securely prevented.

Vibrations can be damped by this device in a substantially the same manner as in the foregoing embodiments based on the movements of the inner sheath member 23 as relative to the outer sheath member 22. Degree of attenuation can be increased as required by applying a voltage between the shaft 21 and the inner sheath member 23.

In the device of the above construction, the movable member 32 is vibrated by means of a vibrating member connected to a split sleeve 34 to cause the electroviscous fluid 3 to flow in between the movable member 32 and a container 31 with an open top and inside the movable member 32 substantially in the same manner as other embodiments described based on the flow resistance intrinsic to the electric members. Degree of damping can be varied as required by generating an electric field in between the movable member 32 and the container 31 with an open upper end and by adjusting the intensity of the electric field.

The bellows 36 that closes the opening of the container 31 sufficiently prevents leakage of the fluid 3 as well as mixing of outside air in the fluid 3.

The present invention damper device of the construction as mentioned above is suitably applied to suspension system of an automobile and position control system using a servo mechanism. In the latter case, a movable element to be controlled of its position using a servo motor is connected to the movable element of this invention. Whenever a large damping force is necessary such as in stopping the movable element, a voltage is applied to the electrodes. During steady operation or acceleration of the movable element when the damping force is not required, the voltage application is suspended. By so controlling the damper device, not only can the movable element even with a greater inertia be promptly control led to stop for positioning but excessive load on the servo motor during steady operation or acceleration can be avoided. Further, such damping effect is stably maintained for an extended period of time.

Thus, the present invention, particularly the bellows can very effectively prevent leakage of the electroviscous fluid and mixing of outside air into the fluid, and therefore the damping capacity of the device can be stably maintained for an extended period of time.

The method of using the damper device will now be described.

Referring to FIGS. 1 and 2, when the electrodes are not applied with a voltage, the electroviscous fluid 3 flows smoothly through the through-holes 2c provided on the portion 2b of the piston 2 with a larger diameter as its viscosity is at the minimum intrinsic level, and the piston 2 can be driven with a sufficiently low force to slide inside the cylinder via the rod 2a by means of a drive means (not shown).

On the other hand, when an electric field is formed between the cylinder 1 and the electrode 4 by applying a voltage thereto, the viscosity of the fluid 3 can be increased to a level corresponding to the intensity of the electric field, exerting an extremely large force on the piston to resist against its movement. When such damper device is used to control positions, suspension and braking of the drive means connected to the piston 2 and application of voltage to the electrode synchronous therewith exert mechanical braking force on the piston 2 so that the vibrations of the piston are forcibly damped by the highly viscous fluid 3 as a result of this mechanical braking.

This means that the spontaneously damped vibrations due to inertia of the piston 2 are decelerated by the action of the electroviscous fluid 3 in an extremely short period time, and the piston 2 can be very quickly stopped and positioned as designated. The time required for positioning the piston 2 is thus significantly reduced, enabling sufficiently precise positioning.

To actuate the movable member, the viscosity of the fluid 3 is decreased by suspending the voltage application on the electrodes and by activating the drive means to cause the piston to slide, whereby the piston 2 can start sliding in the predetermined direction with a sufficiently low resistance.

The sliding of piston 2 can therefore be realized with the minimum energy while the electroviscous fluid 3 is at the minimum level of viscosity.

Figure 9:
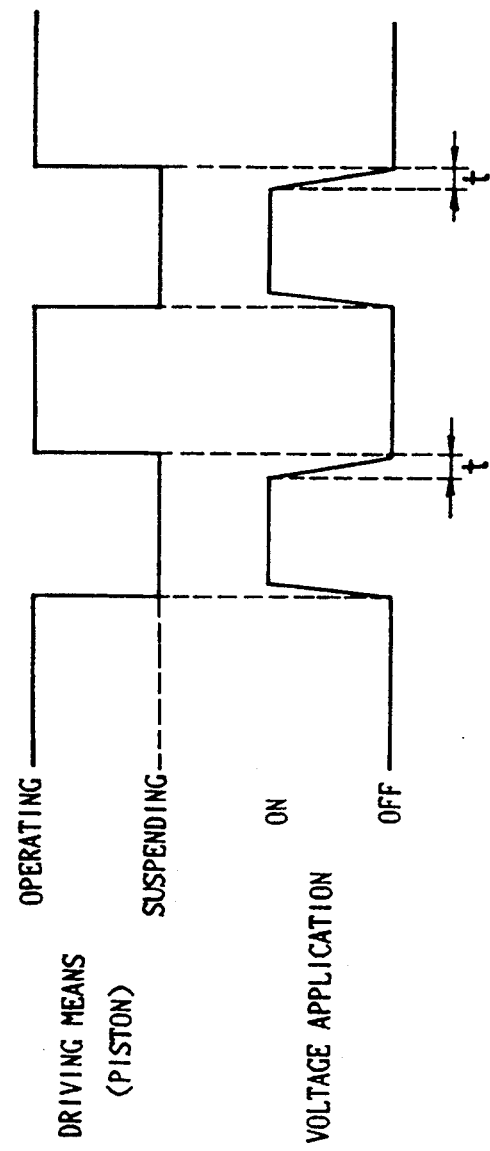
FIG. 9 is a view to show the relation of the operating and suspending timings of a driving means with the ON, OFF timings of the voltage application.

If voltage application to the electrode suspended earlier than actuation of the drive means for the duration of the trailing time t of the voltage to reach 0 V after its application is suspended, as shown in FIG. 9, to take the time constant of the electric circuit into consideration, the viscosity of the fluid 3 can be brought to its minimum level intrinsic thereto from the very start of activation by the drive means, or from the very start of the piston movement. As a result, energy required for activation of the drive means can be reduced and the speed of the piston movement can be increased.

Therefore, by directly or indirectly coupling movable element to be controlled for positioning, in other words, a movable element to be driven by the drive means to the movable member of the damper device of the present invention and by applying a voltage to the electrodes only when the movable element is to be stopped for positioning, while suspending said voltage application when the movable element is in operation, even a movable element with a larger inertia can be quickly controlled to stop for positioning. Load of driving the movable element can also be reduced to a sufficiently low level.

By suspending the voltage application before the movable member is actuated for the trailing time of the voltage, the load for actuating the movable member can be effectively reduced and the movable member can be moved more speedily.

Figure 10:
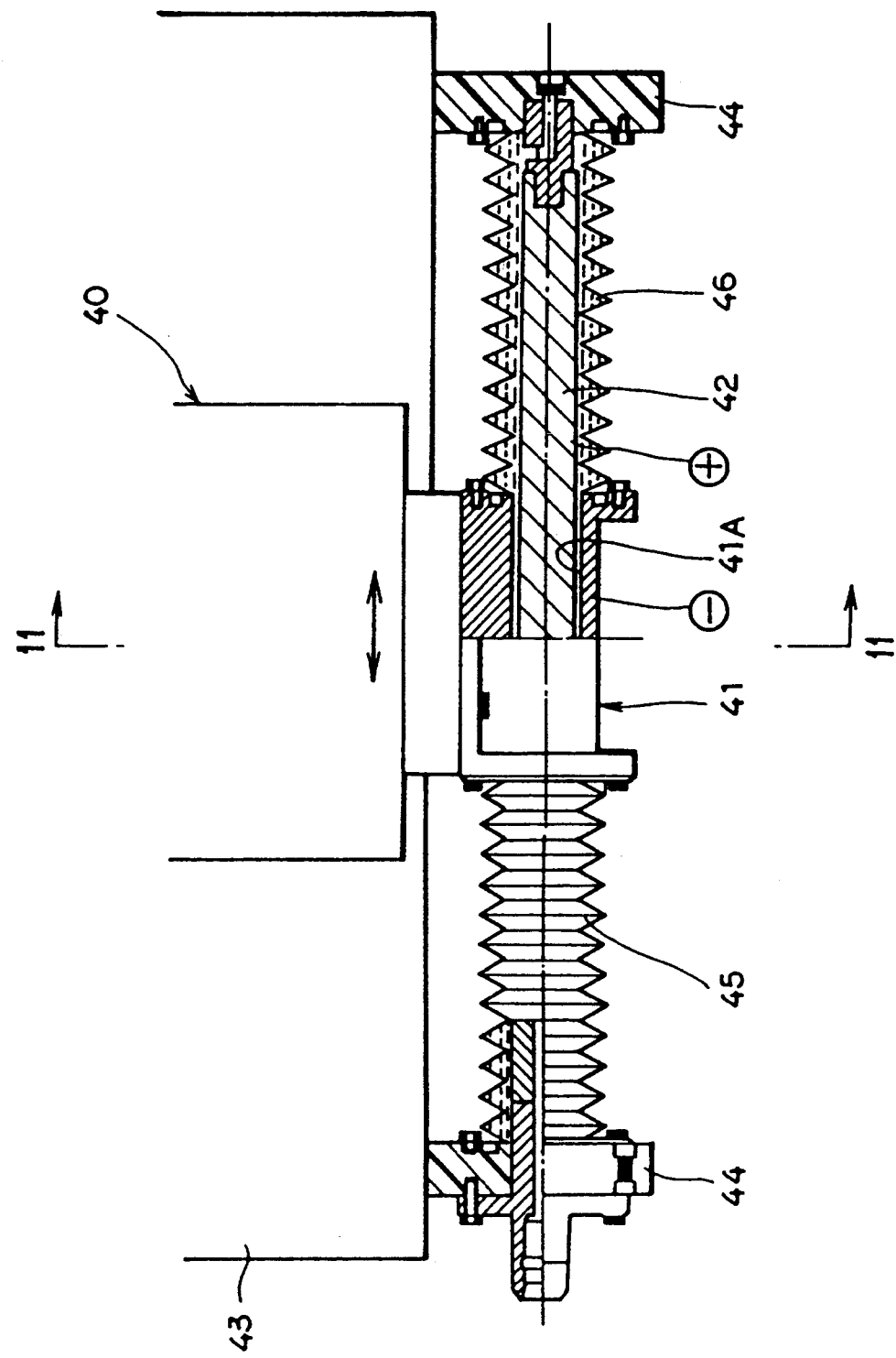
FIG. 10 is a partial sectional view to show semiconductor manufacturing apparatus according to the present invention.
Figure 11:
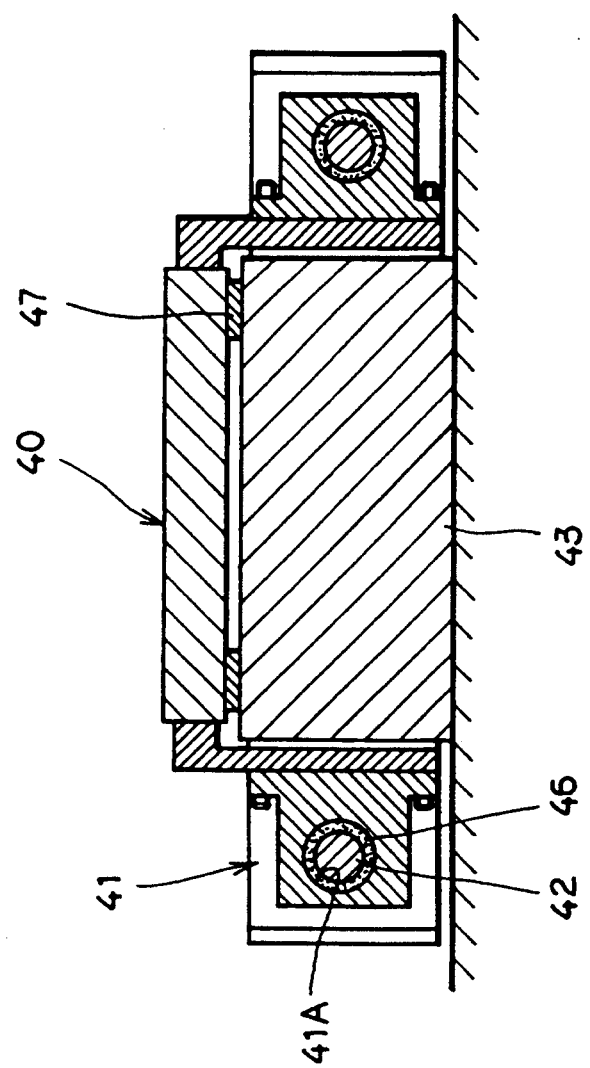
FIG. 11 is a sectional view the line 11—11 in FIG. 10.
Figure 12:
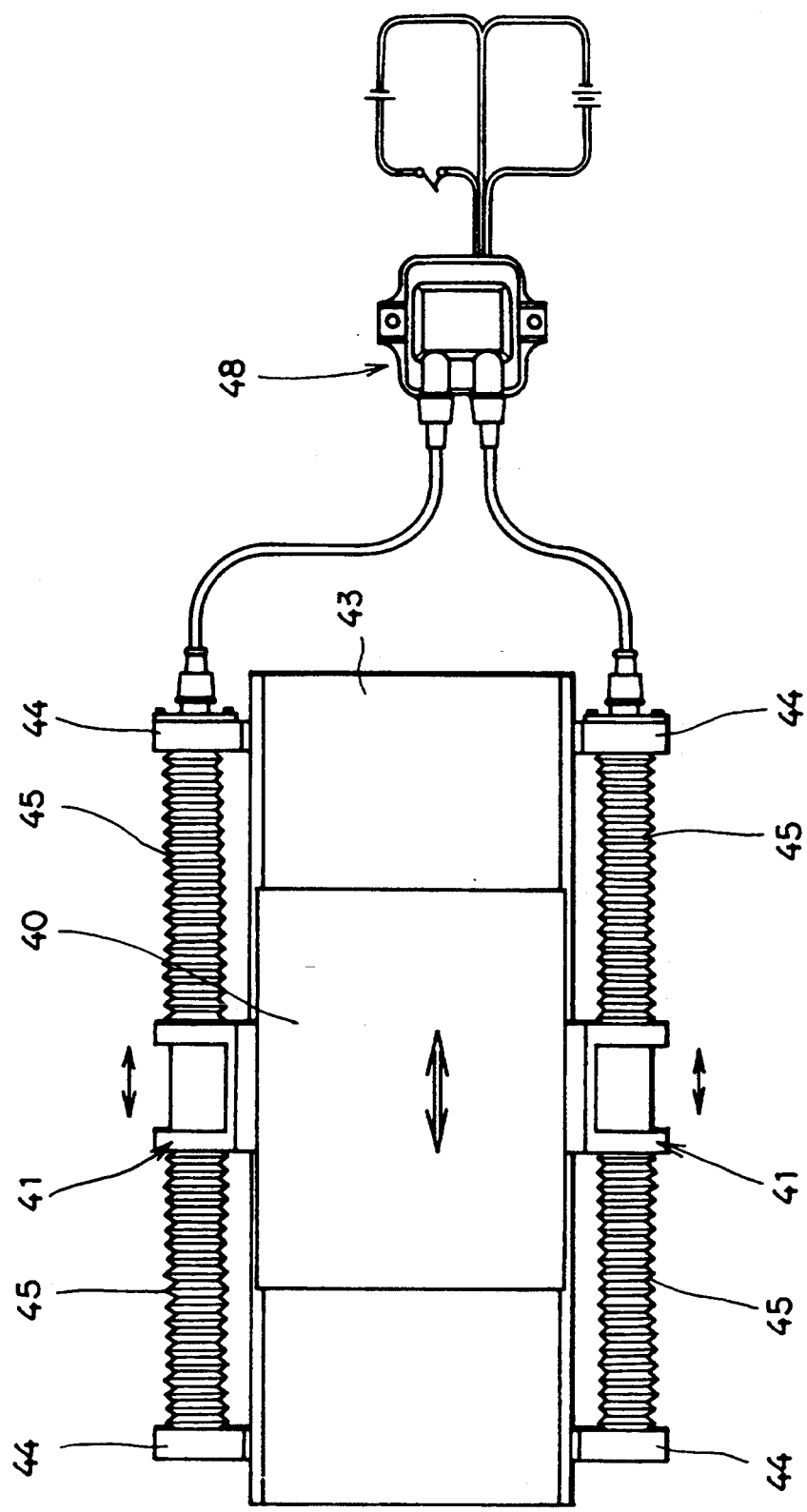
FIG. 12 is a plan view to show the semiconductor apparatus as a whole.

The apparatus for manufacturing semiconductors shown in FIGS. 10 and 11 is called a stepper which moves a silicon wafer when electronic circuits are printed thereon, and comprises an arm 41 attached to its movable member 40. A silicon wafer is placed on the movable member 40 to be printed with circuits by an exposure device (not shown). The arm 41 is movable along the axial line of a fixed guide bar 42 as the movable member 40 is moved. A fixed table 43 is provided with attachment arms 44 for receiving both ends of the guide bar 42. The attachment arms 44 are made of an insulating material. Flexible members 45 such as bellows extend from both ends of the fixed guide bar 42 to both ends of the arm 41 to enclose a space in a liquid-tight manner. A through-hole 41A is formed on the arm 41, and there is provided an interval between the inner peripheral surface of the through-hole 41A and the guide bar 42. An electroviscous fluid 46 is sealed in the internal space of the flexible member as well as in said interval. The arm 41 in this embodiment constitutes a negative electrode while the guide bar 42 comprises a positive electrode. A sliding member 47 is formed at the bottom surface of the movable member 40, and the arm 41 and the fixed table 43 are distance from each other. FIG. 12 is a plan view to show the apparatus in whole, wherein there is provided a power source 48 to apply voltage to the negative and positive electrodes.

In the embodiment shown, the arm 41 and the guide bar 42 are made of an electrode material to constitute a negative and positive electrodes. It is of course possible to provide independent electrodes at positions opposing each other across the fluid 46. These electrodes are adapted to generate an electric field with an intensity corresponding to the level of voltage applied to the electrodes. The flexible member 45 may be made of an flexible material such as rubber or synthetic resin such as polyethylene and polyurethane.

When the electrodes of the apparatus of such construction are not applied with a voltage, the arm 41 moves along the guide bar 42 smoothly as the fluid 46 maintains its intrinsic minimum viscosity and the movable member 40 can be moved with a sufficiently small driving force on the fixed table 43 as it is driven by a drive means such as motor (not shown). To stop the movable member 40 at a predetermined position by suspending the drive means, the positive and negative electrodes are applied with a voltage to increase the viscosity of the electroviscous fluid 46 to a level corresponding to the intensity of the electric field. As the viscosity increases, the arm 41 is subjected to a significant kinetic resistance, and the time required to stop the movable member 40 is shortened. It is noted that by suspending the voltage application earlier than actuation of the drive means for the duration of the trailing time of the voltage from a high level to 0 V to take into consideration the time constant of the electric circuit, the viscosity of the fluid 46 can be lowered to its minimum intrinsic level from the very start of actuation of the drive means, or the very start of the movement of the movable member 40. As a result, the power consumed to activate the drive means can be reduced and the speed of the movable member 40 can be increased.

Figure 13:
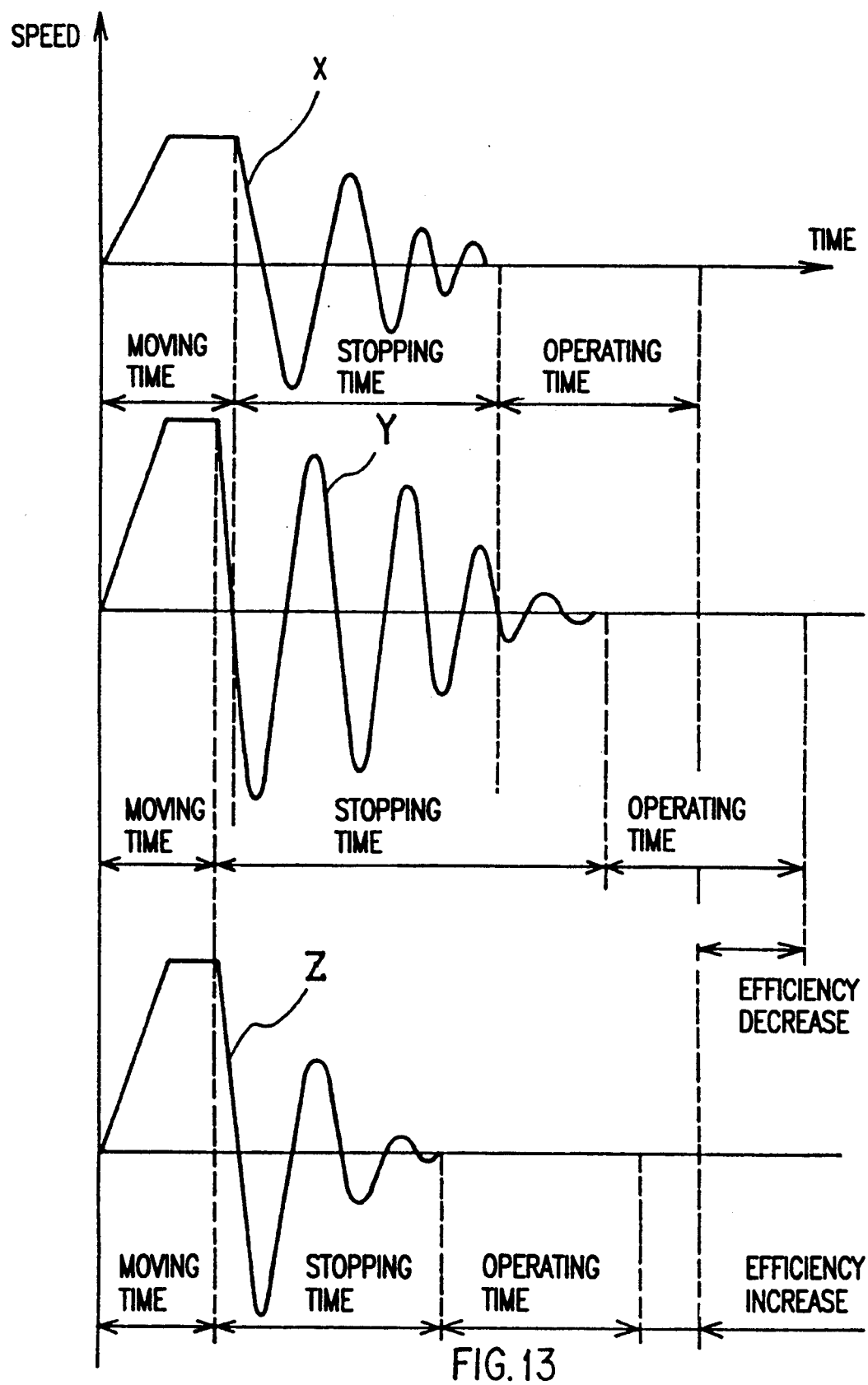
FIG. 13 is a graph to compare the prior art device with the embodiments of the present invention in the time durations required for moving and stopping the movable member.

The graph represented by the letter Z in FIG. 13 shows reduction in the time required in the present invention device to move and stop the movable member 40. Despite the increased speed of the movement of the member 40, the time required to stop the same is shortened as compared with the prior art. When the movable member is t be moved, the voltage applied to the electrodes is suspended to cancel the electric field created between the electrodes to thereby lower the viscosity of the fluid 46 to its minimum level. As a result, the energy for actuating the movable member 40 can be sufficiently reduced, enabling the member 40 to move more quickly. To accurately suspend the member 40 at a given position, voltage is applied to the electrodes to form an electric field therebetween and to thereby increase the viscosity of the fluid 46 to a level corresponding to the intensity of the electric field. The energy for displacing the member 40 relative to the fixed table 43 can be effectively absorbed by the fluid 46. Duration of damped vibrations due to inertia of the movable member 40 can be substantially reduced, and the movable member can be very quickly stopped and positioned.

The graph represented by the letter X in FIG. 13 shows one cycle of operations comprising the steps of moving and stopping the movable member and of printing circuits in the prior art apparatus for manufacturing semiconductors. The prior art apparatus includes a sliding member provided between the movable member and the fixed base to allow the movable member to move on the table, and is characterized in that the movable member is caused to slide on the sliding member when driven by a motor, a silicon wafer is placed atop the movable member to be printed with electric circuits by an exposure means. The graph represented by the letter Y in FIG. 13 shows reduction in time required for moving the movable member when the speed of the movable member is increased.

As has been described in the foregoing, the movable member 40 of the apparatus according to the present invention can be quickly and completely stopped even when its speed is increased, reducing the cycle time and increasing the operational efficiency. As the damping force does not work on the movable member when the latter is moving, the drive means such as motor will not be subjected to a large load and thus easily accelerate the movement of the member 40.

What We Claim is:

1. A device for manufacturing semiconductors comprising a movable member being forcedly moved and stopped at a predetermined position by a drive means, an arm provided on the movable member and moving with the movable member in the axial direction of a fixed guide bar, flexible members being provided between ends of the fixed guide bar and corresponding ends of the arm to maintain an internal space of the device liquid-tight, an electroviscous fluid being sealed inside the flexible members and between the arm and the guide bar, a negative and a positive electrode being formed by utilizing two opposing members including the guide bar and the arm and being connected to a power source for applying and suspending a voltage to the electrodes, said power source operating to begin applying the voltage to the electrodes when the movable member is desired to be stopped and operating to continue said application of the voltage until at least the movable member is completely stopped, whereby the movable member can be quickly and completely stopped at a predetermined position, and said power source operating to begin suspending said application of the voltage on or before starting to move the movable member and continuing said suspension of application of the voltage until the movable member is desired to be stopped, whereby the movable member can be moved quickly.

2. A device as claimed in claim 1, wherein said power source operates to start suspending the application of the voltage before it starts moving the movable member for a duration of time equal to a trailing time of the voltage.

* * * * *